(12) United States Patent
Ishikawa (10) Patent No.: US 7,657,408 B2
(45) Date of Patent: Feb. 2, 2010

(54) STRUCTURAL ANALYSIS APPARATUS, STRUCTURAL ANALYSIS METHOD, AND STRUCTURAL ANALYSIS PROGRAM

(75) Inventor: Shigeo Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 433 days.

(21) Appl. No.: 11/585,281

(22) Filed: Oct. 24, 2006

(65) Prior Publication Data

US 2007/0233436 A1 Oct. 4, 2007

(30) Foreign Application Priority Data

Mar. 29, 2006 (JP) .............................. 2006-090224

(51) Int. Cl.
*G06F 17/10* (2006.01)
*G06F 17/50* (2006.01)
(52) U.S. Cl. .............................................. 703/2; 703/1
(58) Field of Classification Search .................... 703/1, 703/2; 315/420
See application file for complete search history.

(56) References Cited

U.S. PATENT DOCUMENTS

| 7,324,103 B2 * | 1/2008 | Stewart et al. .............. 345/420 |
| 2004/0194051 A1 * | 9/2004 | Croft ............................ 716/20 |
| 2007/0005310 A1 * | 1/2007 | Sakai ............................. 703/2 |

FOREIGN PATENT DOCUMENTS

| JP | 07-055656 | 3/1995 |
| JP | 11-149466 | 6/1999 |

OTHER PUBLICATIONS

Her et al., N.I. Structural Design and Analysis for the KSTAR Cryostat, IEEE 19th Symposium on Fusion Engineering, Jan. 2002, pp. 396-399.*
Van Keulen et al., F. Review of Options for Structural Design Sensitivity Analysis: Part 1: LInear Systems, Sciencedirect, Computer Methods in Applied Mechanics and Engineering, Iss. 30-33, Aug. 2005, pp. 3213-3243.*
Park et al., J.W. Efficient Finite Element Analysis Using Mesh Superposition Technique, Sciencedirect, Finite Elements in Analysis and Design, vol. 39, Iss. 7, Apr. 2003, pp. 619-638.*

* cited by examiner

*Primary Examiner*—Russell Frejd
(74) *Attorney, Agent, or Firm*—Staas & Halsey LLP (57) ABSTRACT

A structural analysis apparatus automatically sets a boundary between an entire model and a detailed model to thereby obtain a highly accurate solution without intervention by an operator and with fewer man-hours and shorter calculation time. An iso-surface creation step creates a field iso-surface from an analysis result of a mesh model. A detailed mesh model creation step uses the field iso-surface created by the iso-surface creation step to create a detailed mesh model of a part of the mesh model. An analysis step uses the analysis result of the mesh model to perform analysis of the detailed mesh model created by the detailed mesh model creation step. An analysis evaluation step evaluates the analysis result of the detailed mesh model based on the analysis result obtained by the analysis step and analysis result of the mesh model.

17 Claims, 8 Drawing Sheets

FIG.2

DETAIL OF NOTCH PART

ENTIRE MODEL

STRUCTURAL ANALYSIS APPARATUS, STRUCTURAL ANALYSIS METHOD, AND STRUCTURAL ANALYSIS PROGRAM

BACKGROUND

1. Field

The present invention relates to a numerical analysis method represented by a structural strength evaluation and, more particularly, to a structural analysis apparatus, a structural analysis method, and a structural analysis program that evaluates the strength of a structure in a development process of, e.g., a portable electronic device.

2. Description of the Related Art

In structural simulation which is taken as an example of structural analysis, an accurate result cannot be obtained in the case where a maximum stress occurring when a load is applied to a structure is calculated, unless the mesh of a stress concentration zone is sufficiently dense. On the other hand, in the case where a part to be actually evaluated in a to-be-modeled area is very small due to a limitation of a restraint condition or loading condition, if the entire evaluation part is divided into meshes of very small size for sufficient evaluation, a calculation amount becomes large. In light of this, a calculation is performed, in two stages, for an entire model. The first stage is performed on a relatively rough model, while the second stage is performed on a detailed model obtained by partially modeling (zooming) the part being evaluated.

Therefore, when numerical analysis of a detailed partial structure (detailed model) is performed for an entire structure (entire model) in a conventional structural analysis, extraction of the detailed model, that is, which part of the entire model is zoomed is manually performed by operators according to their individual judgment.

As a technique related to the prior art, there is known a technique in which analysis is performed by using the entire model of a structure to be analyzed. A partial model is obtained by extracting a part of the entire model of the structure. The detailed partial model is used for analysis of the extracted part and a difference between the analysis results of the partial model and detailed partial model is calculated (refer to, e.g., Patent Document 1: Jpn. Pat. Appln. Publication No. 11-149466).

Further, there is known a technique that allows a mesh with less distortion to be created for a regional model cut out from the entire model easily and immediately (refer to, e.g., Patent Document 2: Jpn. Pat. Appln. Publication No. 7-55656).

When the detailed model is calculated for the abovementioned extraction process, a boundary value of the detailed model which has been calculated for the entire model is used as a boundary condition. At this time, modeling needs to be performed such that the boundary value is not changed due to a difference in the shape between the detailed model and entire model. However, the boundary of the detailed model must be set in advance. Therefore, in the case where an operator arbitrarily sets the boundary of the detailed model as in the conventional way, there is a high possibility that the boundary value is changed due to a difference in the shape between the detailed model and entire model. Further, it is difficult to determine whether the result obtained in the detailed model is sufficiently accurate or not, so that recalculation must be made using the detailed mesh model for verification.

SUMMARY

The present invention has been made to solve the above problems, and an object thereof is to provide a structural analysis apparatus, a structural analysis method, and a structural analysis program capable of automatically setting the boundary between the entire model and detailed model to thereby obtain a highly accurate solution without the intervention of an operator and with fewer man-hours and shorter calculation time.

To solve the above problems, according to a first aspect of the present invention, there is provided a structural analysis apparatus using a mesh model obtained by dividing a model into meshes to perform analysis of displacement or stress, comprising: an iso-surface creation section that creates a field iso-surface from an analysis result of the mesh model; a detailed mesh model creation section that uses the field iso-surface created by the iso-surface creation section to create a detailed mesh model of a part of the mesh model; an analysis section that uses the analysis result of the mesh model to perform analysis of the detailed mesh model created by the detailed mesh model creation section; and an analysis evaluation section that evaluates the analysis result of the detailed mesh model based on the analysis result obtained by the analysis section and analysis result of the mesh model.

In the structural analysis apparatus according to the present invention, the analysis section acquires the boundary value of the detailed mesh model from the analysis result of the mesh model and uses the boundary value to analyze the detailed mesh model.

In the structural analysis apparatus according to the present invention, the detailed mesh model creation section includes: a first detailed mesh model creation section that creates a first detailed mesh model with the same mesh size as that of the mesh model; and a second detailed mesh model creation section that creates a second detailed mesh model with a finer mesh size obtained by reducing the mesh size of the first detailed mesh model to a predetermined size, the analysis section analyzes the second detailed mesh model based on a first boundary value obtained by the analysis of the mesh model to obtain a second boundary value of the first detailed mesh model and uses the second boundary value to analyze the first detailed mesh model, and the analysis evaluation section performs a first analysis evaluation based on the analysis result of the first detailed mesh model obtained by the analysis section and analysis result of the mesh model.

In the structural analysis apparatus according to the present invention, the analysis evaluation section performs the first analysis evaluation based on displacement of boundary contacts obtained as the analysis result of the first detailed mesh model and displacement of boundary contacts obtained as the analysis result of the mesh model.

In the structural analysis apparatus according to the present invention, the analysis evaluation section performs a second analysis evaluation based on the analysis result of the second detailed mesh model and analysis result of the first detailed mesh model.

In the structural analysis apparatus according to the present invention, the analysis evaluation section performs the second analysis evaluation based on the maximum stress obtained as the analysis result of the second detailed mesh model and maximum stress obtained as the analysis result of the first detailed mesh model.

In the structural analysis apparatus according to the present invention, if the evaluation made by the analysis evaluation section does not satisfy a predetermined condition, the iso-surface creation section reduces the field value so as to create a new field iso-surface.

According to a second aspect of the present invention, there is provided a structural analysis method in which a computer uses a mesh model obtained by dividing a model into meshes to perform analysis of displacement or stress, comprising: an iso-surface creation step that creates a field iso-surface from an analysis result of the mesh model, a detailed mesh model creation step that uses the field iso-surface created by the iso-surface creation step to create a detailed mesh model of a part of the mesh model; an analysis step that uses the analysis result of the mesh model to perform analysis of the detailed mesh model created by the detailed mesh model creation step; and an analysis evaluation step that evaluates the analysis result of the detailed mesh model based on the analysis result obtained by the analysis step and analysis result of the mesh model.

In the structural analysis method according to the present invention, the analysis step acquires the boundary value of the detailed mesh model from the analysis result of the mesh model and uses the boundary value to analyze the detailed mesh model.

In the structural analysis method according to the present invention, the detailed mesh model creation step includes: a first detailed mesh model creation step that creates a first detailed mesh model with the same mesh size as that of the mesh model; and a second detailed mesh model creation step that creates a second detailed mesh model with a finer mesh size obtained by reducing the mesh size of the first detailed mesh model to a predetermined size, the analysis step analyzes the second detailed mesh model based on a first boundary value obtained by the analysis of the mesh model to obtain a second boundary value of the first detailed mesh model and uses the second boundary value to analyze the first detailed mesh model, and the analysis evaluation step performs a first analysis evaluation based on the analysis result of the first detailed mesh model obtained by the analysis step and analysis result of the mesh model.

In the structural analysis method according to the present invention, the analysis evaluation step performs the first analysis evaluation based on displacement of boundary contacts obtained as the analysis result of the first detailed mesh model and displacement of boundary contacts obtained as the analysis result of the mesh model.

In the structural analysis method according to the present invention, the analysis evaluation step performs a second analysis evaluation based on the analysis result of the second detailed mesh model and analysis result of the first detailed mesh model.

In the structural analysis method according to the present invention, the analysis evaluation step performs the second analysis evaluation based on the maximum stress obtained as the analysis result of the second detailed mesh model and maximum stress obtained as the analysis result of the first detailed mesh model.

In the structural analysis method according to the present invention, if the evaluation made by the analysis evaluation step does not satisfy a predetermined condition, the iso-surface creation step reduces the field value so as to create a new field iso-surface and the above respective steps are repeated to allow the analysis evaluation step to make evaluation once again.

In the structural analysis method according to the present invention, in the case where the first analysis evaluation made by the analysis evaluation step satisfies a predetermined condition, if the second analysis evaluation does not satisfy a predetermined condition, the above respective steps are repeated with the mesh size of the mesh model replaced by the mesh size of the second detailed mesh model to allow the analysis evaluation step to make evaluation once again.

According to a third aspect of the present invention, there is provided a structural analysis program allowing a computer to execute a structural analysis method that uses a mesh model obtained by dividing a model into meshes to perform analysis of displacement or stress, the program allowing the computer to execute: an iso-surface creation step that creates a field iso-surface from an analysis result of the mesh model; a detailed mesh model creation step that uses the field iso-surface created by the iso-surface creation step to create a detailed mesh model of a part of the mesh model; an analysis step that uses the analysis result of the mesh model to perform analysis of the detailed mesh model created by the detailed mesh model creation step; and an analysis evaluation step that evaluates the analysis result of the detailed mesh model based on the analysis result obtained by the analysis step and analysis result of the mesh model.

According to the present invention, it is possible to automatically set the boundary between the entire model and detailed model and thereby to obtain a highly accurate solution without the intervention of an operator and with fewer man-hours and shorter calculation time than in the case where a conventional zooming analysis method is used.

DETAILED DESCRIPTION OF THE PREFERRED EMBODIMENTS

An embodiment of the present invention will be described below with reference to the accompanying drawings.

Figure 1:
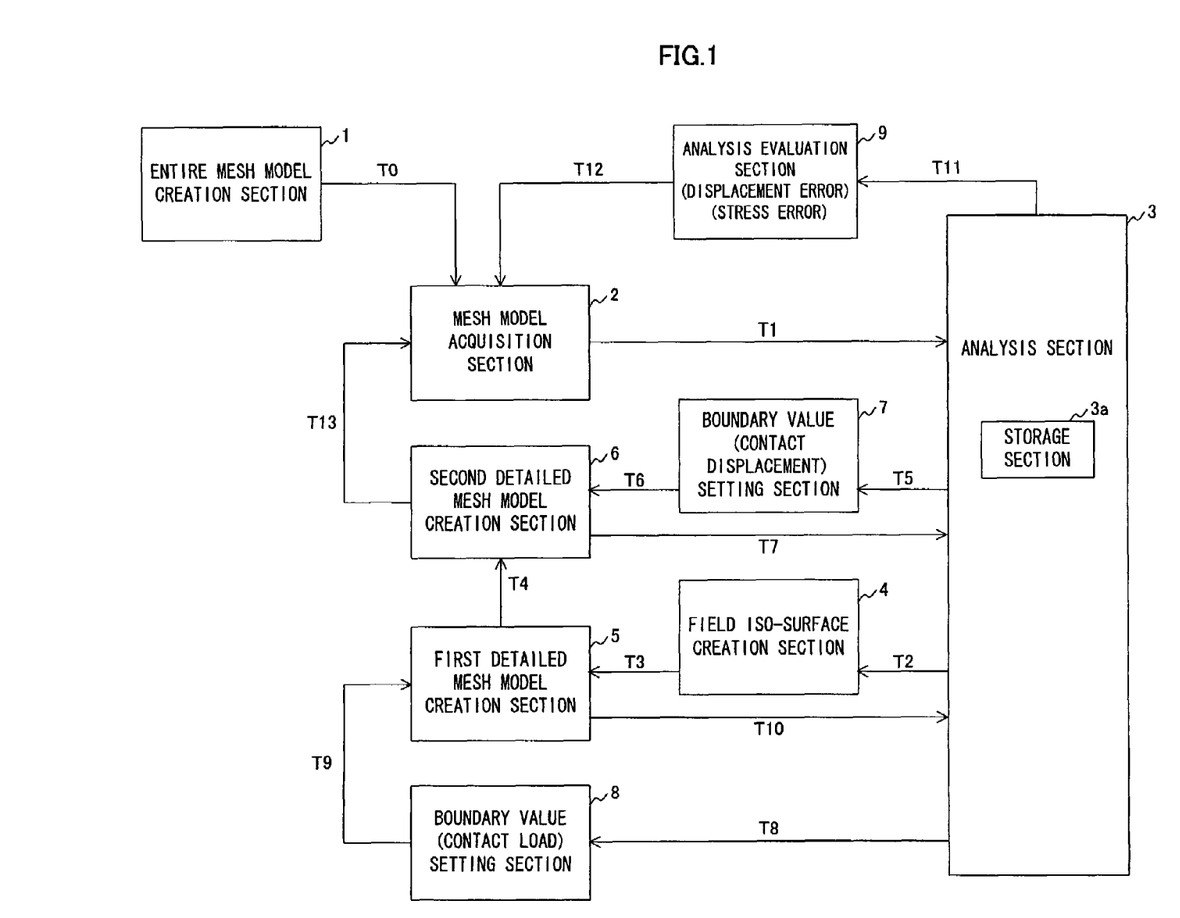
FIG. 1 is a block diagram showing the entire configuration of a structural analysis apparatus according to an embodiment of the present invention.
Figure 2:
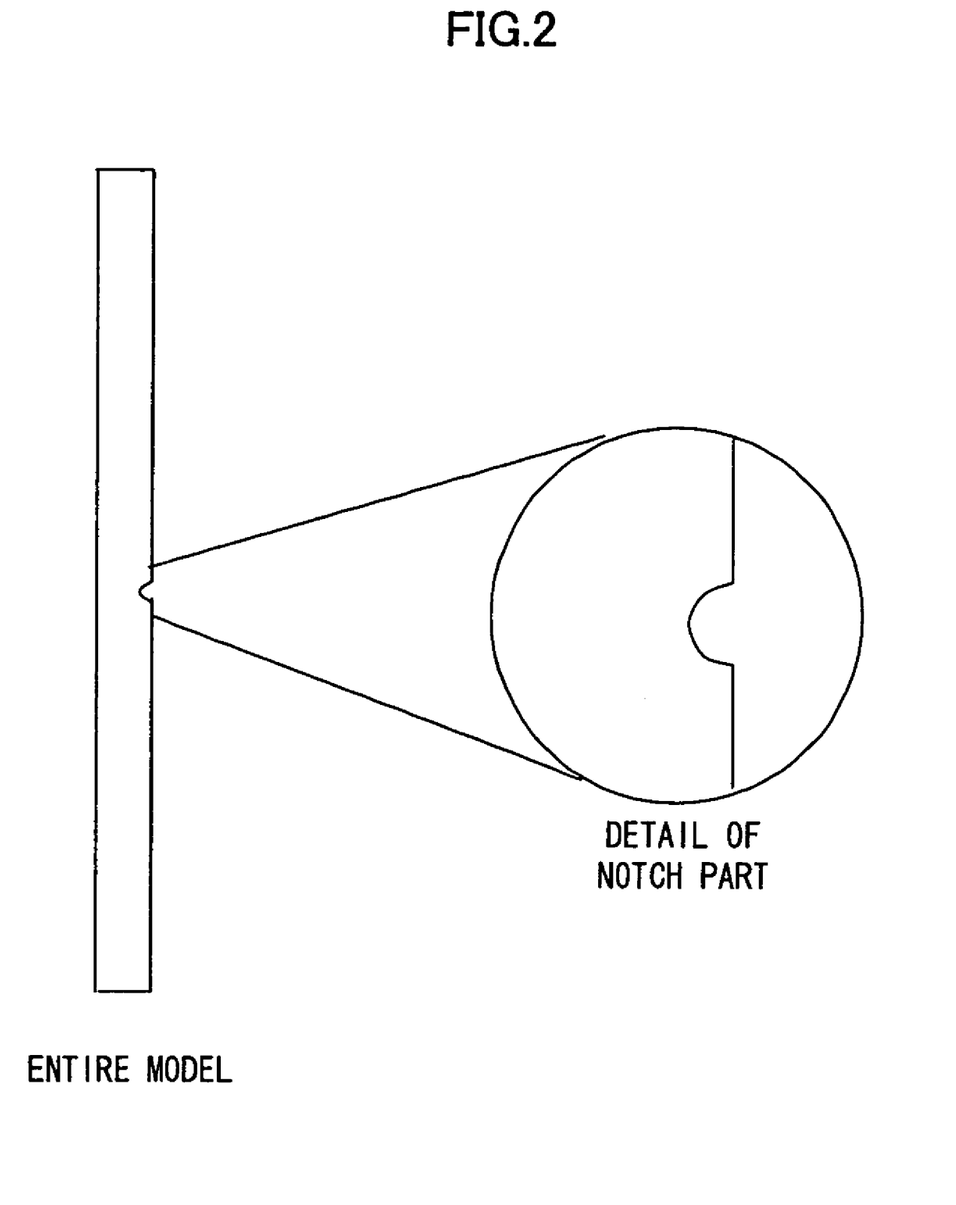
FIG. 2 is an overall view of a model to be analyzed (prism model with a minute notch) and partially detailed view thereof.
Figure 3:
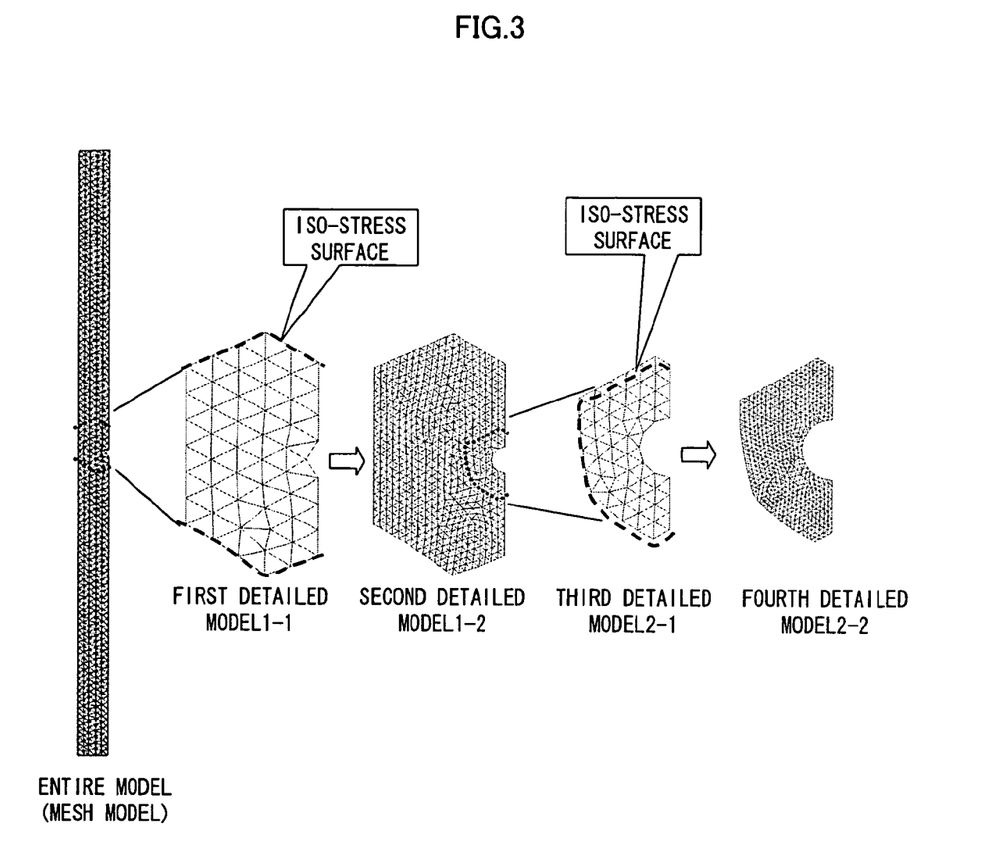
FIG. 3 is a conceptual view showing a process of sequentially creating a detailed mesh model from an entire model (mesh model)

FIG. 1 is a block diagram showing the entire configuration of a structural analysis apparatus according to an embodiment of the present invention. FIG. 2 is an overall view of a model to be analyzed (prism model with a minute notch) and partially detailed view thereof. FIG. 3 is a conceptual view showing a process of sequentially creating a detailed mesh model from an entire model (mesh model).

As shown in FIG. 1, a structural analysis apparatus according to the present embodiment includes an entire mesh model creation section 1 that creates an entire mesh model from its original entire model and a mesh model acquisition section 2 that acquires the mesh model created by the entire mash model creation section 1 (T0). The entire mesh model creation section 1 and mesh model acquisition section 2 may be integrated in one component.

The structural analysis apparatus further includes an analysis section 3 that uses the mesh model acquired by the mesh model acquisition section 2 (T1) to analyze displacement and stress according to, e.g., a finite element method, a field iso-surface creation section 4 that uses an analysis result obtained by the analysis section 3 (T2) to create an iso-stress-surface as a field iso-surface, and a first detailed mesh model creation section 5 that uses the iso-surface obtained by the field iso-surface creation section 4 (T3) to create a first detailed model.

As a model part used as the first detailed mesh model, a part that requires more detailed analysis is selected from the entire mesh model, as shown in FIG. 2. Note that the mesh size of the first detailed mesh model is the same as that of the mesh model obtained by the mesh model acquisition section 2.

The structural analysis apparatus according to the present embodiment further includes a second detailed mesh model creation section 6 that uses the first detailed mesh model created by the first detailed mesh model creation section 5 (T4) to create the second detailed mesh model with a finer mesh size, a boundary value (contact displacement) setting section 7 that uses an analysis result for the entire mesh model (T5) to give contact displacement to the second detailed mesh model obtained by the second detailed mesh model creation section 6 (T6), and a boundary value (contact load) setting section 8 that uses the analysis section 3 to analyze the second detailed mesh model to which the boundary value has been given (T7) and uses its analysis result (T8) to give contact load to the first detailed mesh model (T9).

The structural analysis apparatus further includes an analysis evaluation section 9 that uses the analysis section 3 to analyze the first detailed mesh model to which the boundary value has been given (T10) and uses its analysis result and an analysis result for the entire mesh model (T11) to perform analysis evaluation. When the analysis evaluation section 9 outputs an evaluation result, the entire analysis process is completed. In the case where a more detailed mesh model is analyzed or the iso-stress is changed to a smaller value, the above mentioned analysis process is repeated. Note that, in the present embodiment, the analysis section 3 has a storage section 3a. Every time the analysis section 3 performs analysis for one model, it stores a result of the analysis in the storage section 3a so as to appropriately output the result.

An operation of the present embodiment will next be described in more detail using flowcharts shown in FIGS. 4 to 8. For simplicity, in the following description, the term "entire mesh model" is referred to merely as "entire model" and, in the following flowcharts, first to fourth detailed mesh models 1-1 to 2-2 are referred to merely as detailed models 1-1 to 2-2, respectively.

Figure 4:
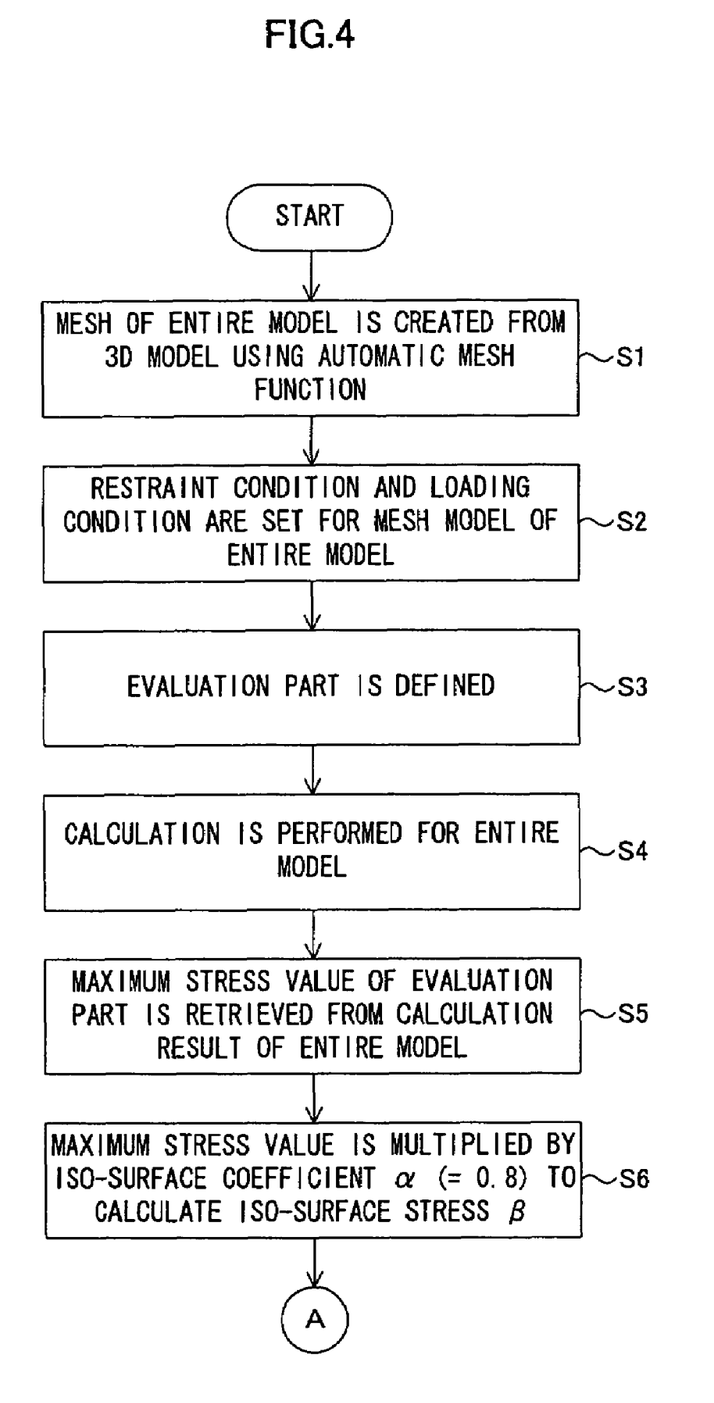
FIG. 4 is a first flowchart showing operation of the embodiment of the present invention.

An entire model is created from a 3D model using an automatic mesh function (step S1). Subsequently, a restraint condition and loading condition are set for the mesh model of the entire model (step S2). Then a part to be evaluated (notch part, in the case of FIG. 2) is defined (step S3). Note that another part may be set as the evaluation part. After that, calculation (displacement calculation and stress calculation) for the entire model is performed (step S4), and the maximum stress value of the evaluation part is retrieved from the calculation result of the entire model (step S5). Note that an analysis method of the present embodiment firstly calculates displacement of each element and calculates stress based on the obtained displacement.

Subsequently, the maximum stress value is multiplied by an iso-surface coefficient α (e.g., 0.8) to calculate an iso-surface stress β (step S6). Then a 3D surface defined by the iso-surface is created (calculated) from the entire model (step S7).

After obtaining the iso-surface, the surface defined by the iso-surface is used to cut out a detailed part from the 3D model as 3D data (step S8). Subsequently, a first detailed mesh model 1-1 is created from the cut out detailed model with the same mesh size as that of the entire model (step S9). In the case of a 3D model, the mesh size of a second detailed mesh model is calculated according to the following formula with the number of meshes used here set to $N_1$ (step S10).

($N_1$/mesh number of entire model)$^{1/3}$×mesh size of entire model

Figure 5:
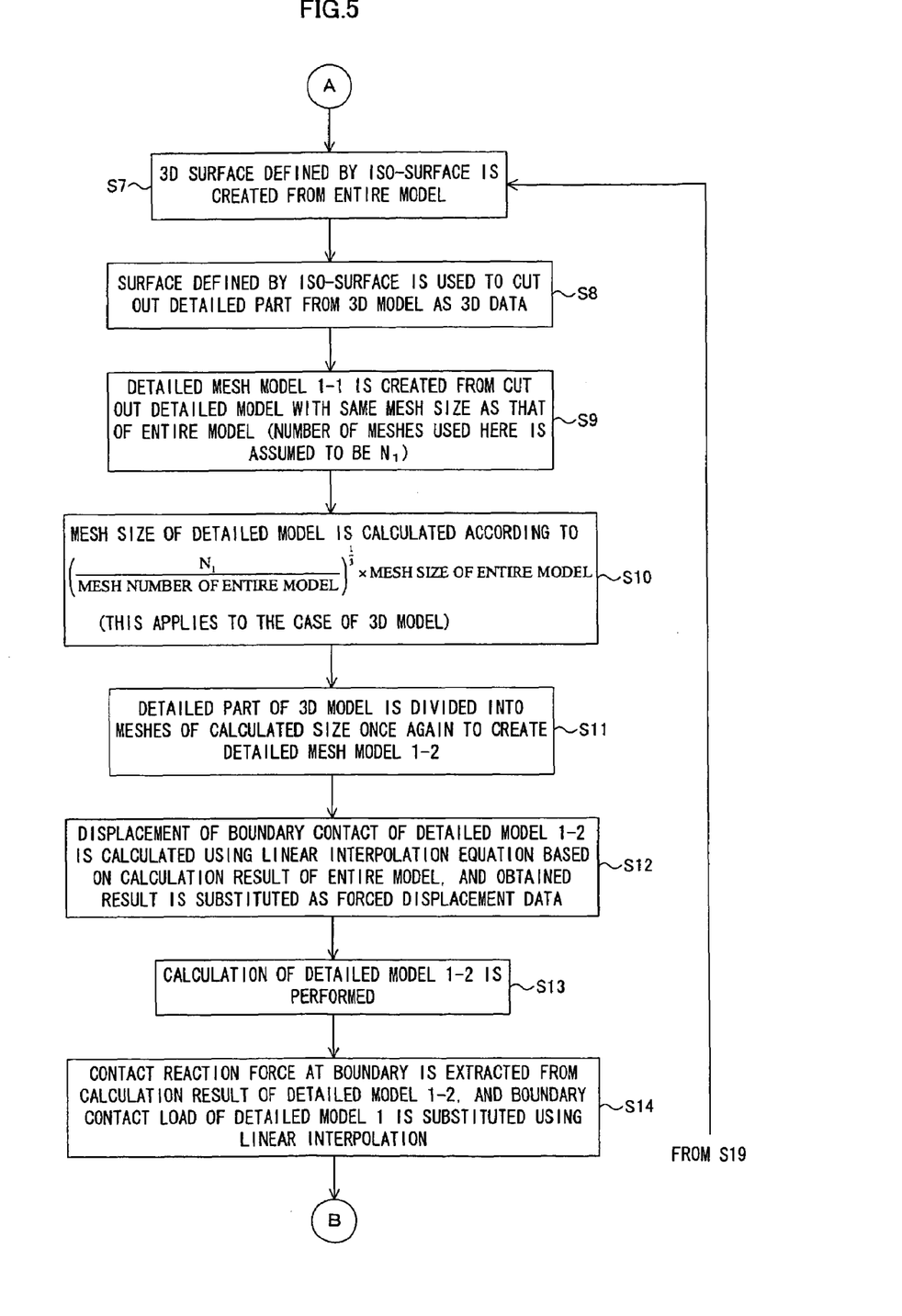
FIG. 5 is a second flowchart showing operation of the embodiment of the present invention.

After calculation of the mesh size, the detailed part of the 3D model is divided into meshes of the calculated size once again to create a second detailed mesh model 1-2 (step S11). At the same time, displacement of boundary contacts of the second detailed mesh model 1-2 is calculated using a linear interpolation equation based on the calculation result of the entire model, the obtained result is substituted as forced displacement data (step S12), and the displacement and stress of the second detailed mesh model 1-2 are calculated (step S13).

Subsequently, contact reaction force on the boundary is extracted from the calculation result of the displacement and stress of the second detailed mesh model 1-2, contact load on boundary contacts of the first detailed mesh model 1-1 is substituted using a linear interpolation (step S14), and the first detailed mesh model 1-1 is calculated (step S15). Further, a displacement Dd of the boundary contacts is output based on the calculation result of the first detailed mesh model 1-1 (step S16) and a displacement Da of the boundary contacts is output based on the calculation result of the entire model (step S17).

Subsequently, the displacement Dd of the boundary contacts of the first detailed mesh model 1-1 and displacement Da of the boundary contacts of the entire model are used to determine an error (step S18). This error determination is made using the following inequality.

$$-0.01 < Dd/Da - 1.0 < 0.01$$

If the error does not fall within the predetermined range in step S18 (No in step S18), the iso-surface stress β is updated to, e.g., its half value (β=β/2.0) (step S19) and flow returns to step S7.

Figure 6:
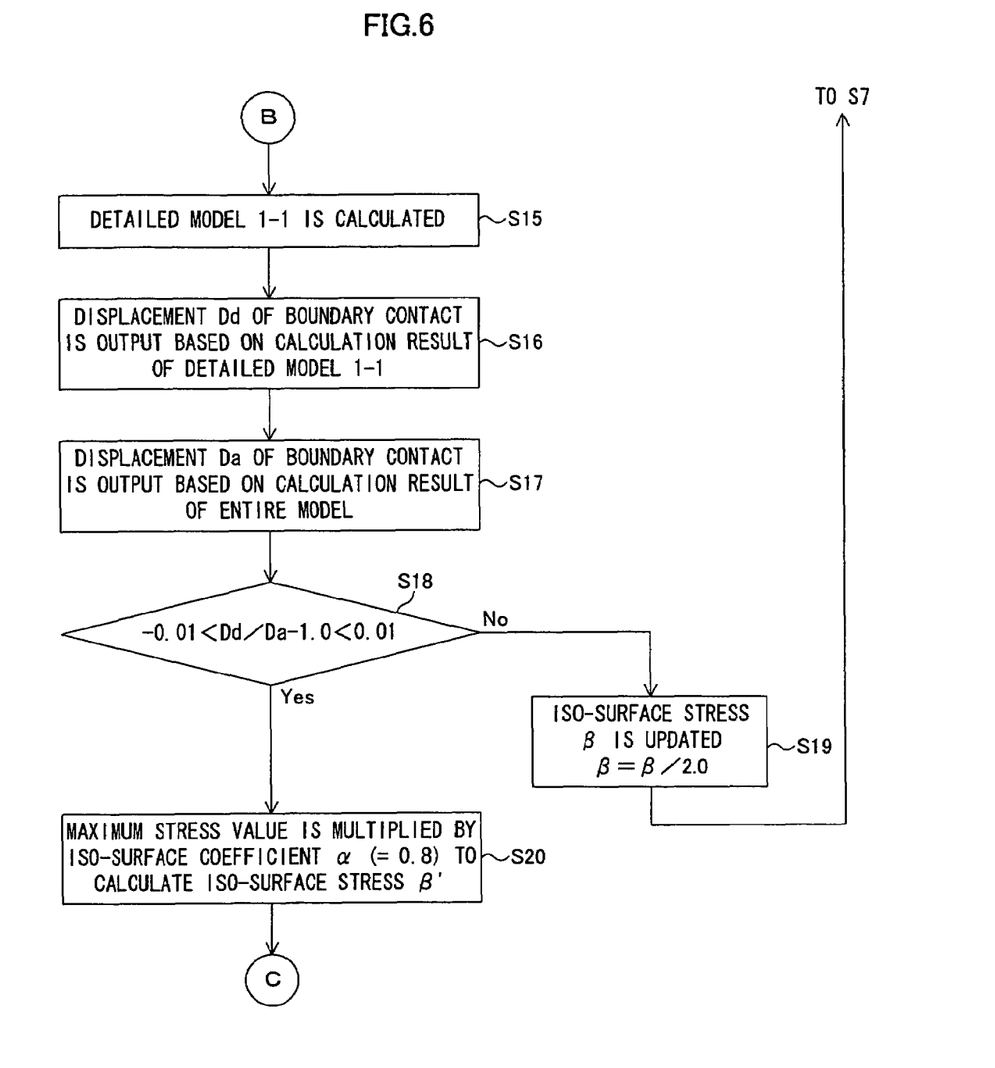
FIG. 6 is a third flowchart showing operation of the embodiment of the present invention.

If the error falls within the predetermined range, the detailed model creation process is allowed to proceed to the next step. Then, the maximum stress value obtained in the calculation of the second detailed mesh model 1-2 is multiplied by the iso-surface coefficient α (=0.8) to calculate an iso-surface stress β' (step S20). Subsequently, a 3D surface defined by the iso-surface is created from the second detailed mesh model 1-2 (step S21).

Further, the surface defined by the iso-surface is used to cut out a more detailed part from the 3D model as 3D data (step S22). A third detailed mesh model 2-1 is then created from the cut out detailed model with the same mesh size as that of the detailed model 1-2.

The number of meshes used here is set to $N_2$ (step S23). In the case of a 3D model, the mesh size of the third detailed mesh model is calculated according to the following formula (step S24).

Figure 7:
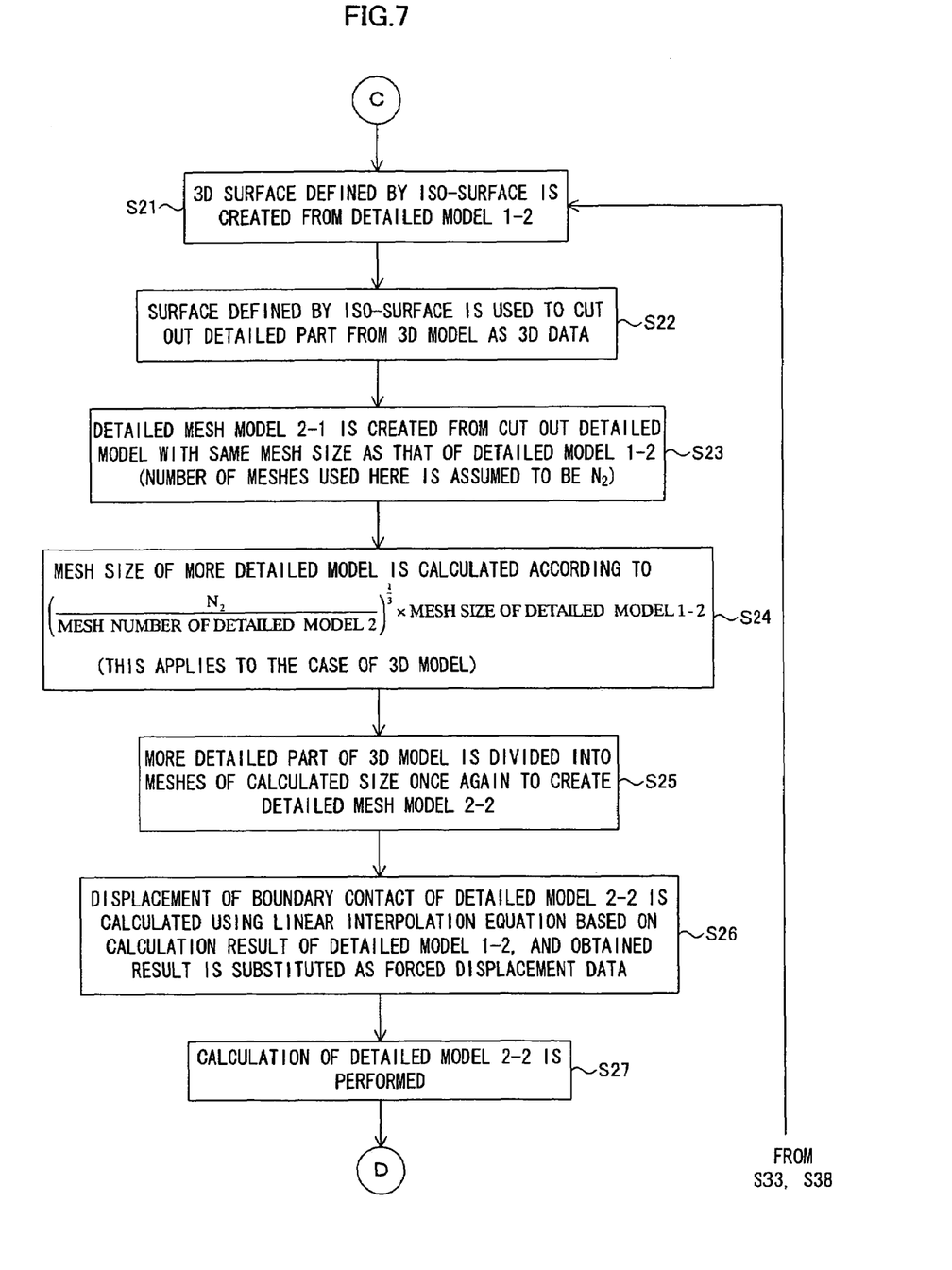
FIG. 7 is a fourth flowchart showing operation of the embodiment of the present invention.

($N_2$/mesh number of second detailed mesh model)$^{1/3}$×mesh size of second detailed mesh model The more detailed part of the 3D model is divided into meshes of the calculated size once again to create a fourth detailed mesh model 2-2 (step S25). At the same time, the displacement of the boundary contacts of the fourth detailed mesh model 2-2 is calculated using a linear interpolation equation based on the calculation result of the second detailed mesh model 1-2, the obtained result is substituted as forced displacement data (step S26), and the fourth detailed mesh model 2-2 is calculated (step S27).

Subsequently, contact reaction force on the boundary is extracted from the calculation result of the fourth detailed mesh model 2-2, the contact load on the boundary contacts of the third detailed mesh model 2-1 is substituted using a linear interpolation (step S28), and the third detailed mesh model 2-1 is calculated (step S29).

Then, the displacement Dd of the boundary contacts is output based on the calculation result of the third detailed mesh model 2-1 (step S30) and displacement Da of the boundary contacts is output based on the calculation result of the detailed model 1-2 (step S31).

Subsequently, the displacement Dd of the boundary contacts of the third detailed mesh model 2-1 and displacement Da of the boundary contacts of the second detailed mesh model 1-2 are used to determine an error (step S32). This error determination is made using the following inequality.

$$-0.01 < Dd/Da - 1.0 < 0.01$$

If the error does not fall within the predetermined range in step S32 (No in step S32), the iso-surface stress β is updated to, e.g., its half value (β=β/2.0) (step S33) and flow returns to step S21.

Figure 8:
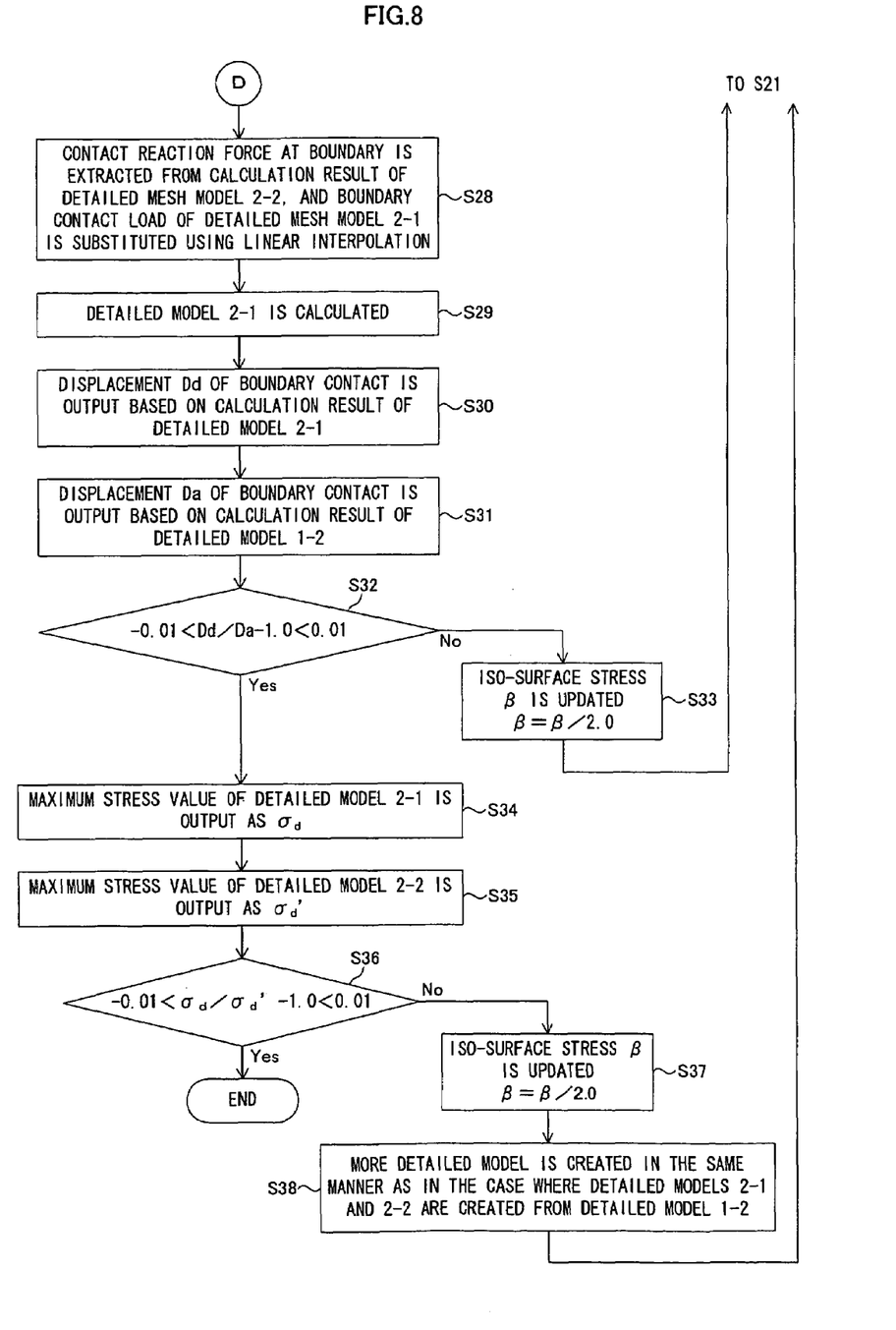
FIG. 8 is a fifth flowchart showing operation of the embodiment of the present invention.

If the error falls within the predetermined range in step S32 (Yes in step S32), the maximum stress value of the third detailed mesh model 2-1 is output as $\sigma_d$ (step S34) and, at the same time, the maximum stress value of the fourth detailed mesh model 2-2 is output as $\sigma_d'$ (step S35).

Subsequently, the maximum stress $\sigma_d$ of the third detailed mesh model 2-1 and maximum stress $\sigma_d'$ of the fourth detailed mesh model 2-2 are used to determine an error of the maximum stress (step S36). This error determination is made using the following inequality.

$$-0.01 < \sigma_d/\sigma_d' - 1.0 < 0.01$$

If the error does not fall within the predetermined range (No in step S36), the iso-surface stress β is updated (β=β/2.0) (step S37). Then, with "second detailed mesh model" replaced by "fourth mesh model", "third detailed mesh model" replaced by "fifth mesh model", and "fourth mesh model" replaced by "sixth mesh model", more detailed mesh models are created in the same manner as in the case where the third and fourth detailed mesh models are created from the second detailed mesh model 1-2 followed by calculation of each created model. After that, creation process of the detailed mesh model is repeated until the maximum displacement and maximum stress fall within the predetermined error ranges. At the time point when these errors fall within the predetermined ranges, the creation process is completed.

As described above, the embodiment of the present invention has the following configuration.

The field value (80% of the maximum value) for generating the boundary surface of the detailed model is determined based on the field maximum value of the evaluation part which is calculated for the entire model. The field iso-surface is generated based on the calculation result of the entire model in order to generate the determined boundary surface. By cutting out the detailed model using the obtained field iso-surface from the entire model, creation of the appropriate detailed model can be achieved without intervention of an operator.

With the above configuration, refinement of the mesh model is automatically done by a process defined in a zooming method, guaranteeing that the result of the boundary value is not changed due to a difference in the shape between the detailed model and entire model. By modeling only the entire model for calculation, the following refinement process can automatically be executed. Thus, the man-hour necessary for the analysis can be reduced.

Further, whether the result obtained for the detailed model has sufficient accuracy or not is determined and, if the accuracy is not satisfactory, the detailed model is automatically created for multistage zooming analysis until sufficient accuracy is achieved.

With the above configuration, the multistage zooming analysis can automatically be executed until sufficient accuracy is achieved, so that a highly accurate solution can be obtained with fewer operation man-hours. Assuming that the entire model is divided into meshes with the same mesh size as that of the detailed model and that the ratio of the mesh size is 10 times, the scale of the 3D model becomes 1000 times. Since calculation time is proportional to the square of the number of contacts, calculation time of up to 1,000,000 times that required for analysis of the detailed model is required. By using the abovementioned method, it is possible to obtain a solution having equivalent accuracy with calculation time of several times that required for analysis of the entire model.

In the above embodiment of the present invention, by storing the above steps shown in the flowcharts in a computer-readable storage medium as a structural analysis program, it is possible to allow a computer to execute the structural analysis program. The computer-readable storage medium mentioned here includes: a portable storage medium such as a CD-ROM, a flexible disk, a DVD disk, a magneto-optical disk, or an IC card; a database that holds computer program; and another computer and database thereof.

What is claimed is:

1. A structural analysis apparatus, comprising:
a storage for storing a result of an analysis of a mesh model;
an iso-surface creation section that creates a field iso-surface from an analysis result of a mesh model, using the mesh model obtained by dividing a model into meshes to perform analysis of displacement or stress;
a detailed mesh model creation section that uses the field iso-surface created by the iso-surface creation section to create a detailed mesh model which is a part of the mesh model and a characteristic part of the mesh model;
an analysis section that uses the analysis result of the mesh model stored in the storage to perform analysis of the detailed mesh model created by the detailed mesh model creation section; and
an analysis evaluation section that evaluates the analysis result of the detailed mesh model based on the analysis result obtained by the analysis section, and analysis result of the mesh model; wherein
the detailed mesh model creation section includes: a first detailed mesh model creation section that creates a first detailed mesh model with the same mesh size as that of the mesh model; and a second detailed mesh model creation section that creates a second detailed mesh model with a finer mesh size obtained by reducing the mesh size of the first detailed mesh model to a predetermined size,
the analysis section analyzes the second detailed mesh model based on a first boundary value obtained by the analysis of the mesh model to obtain a second boundary value of the first detailed mesh model and uses the second boundary value to analyze the first detailed mesh model, and the analysis evaluation section performs a first analysis evaluation based on the analysis result of the first detailed mesh model obtained by the analysis section, and analysis result of the mesh model; and a display displaying the evaluation of the analysis result of the detailed mesh model.

2. The structural analysis apparatus according to claim 1, wherein the analysis section acquires a boundary value of the detailed mesh model from the analysis result of the mesh model and uses the boundary value to analyze the detailed mesh model.

3. The structural analysis apparatus according to claim 1, wherein the analysis evaluation section performs the first analysis evaluation based on displacement of boundary contacts obtained as the analysis result of the first detailed mesh model and displacement of boundary contacts obtained as the analysis result of the mesh model.

4. The structural analysis apparatus according to claim 1, wherein the analysis evaluation section performs a second analysis evaluation based on the analysis result of the second detailed mesh model and analysis result of the first detailed mesh model.

5. The structural analysis apparatus according to claim 4, wherein the analysis evaluation section performs the second analysis evaluation based on the maximum stress obtained as the analysis result of the second detailed mesh model and maximum stress obtained as the analysis result of the first detailed mesh model.

6. The structural analysis apparatus according to claim 1, wherein if the evaluation made by the analysis evaluation section does not satisfy a predetermined condition, the iso-surface creation section reduces the field value so as to create a new field iso-surface.

7. A structural analysis method, comprising:

providing a storage for storing a result of an analysis of a mesh model;

an iso-surface creation step that creates a field iso-surface from an analysis result of the mesh model, in which a computer uses the mesh model obtained by dividing a model into meshes to perform analysis of displacement or stress;

a detailed mesh model creation step that uses the field iso-surface created by the iso-surface creation step to create a detailed mesh model which is a part of the mesh model and a characteristic part of the mesh model;

an analysis step that uses the analysis result of the mesh model stored in the storage to perform analysis of the detailed mesh model created by the detailed mesh model creation step; and an analysis evaluation step that evaluates the analysis result of the detailed mesh model based on the analysis result obtained by the analysis steps and analysis result of the mesh model; wherein the detailed mesh model creation step includes: a first detailed mesh model creation step that creates a first detailed mesh model with the same mesh size as that of the mesh model; and a second detailed mesh model creation step that creates a second detailed mesh model with a finer mesh size obtained by reducing the mesh size of the first detailed mesh model to a predetermined size, the analysis step analyzes the second detailed mesh model based on a first boundary value obtained by the analysis of the mesh model to obtain a second boundary value of the first detailed mesh model and uses the second boundary value to analyze the first detailed mesh model, and the analysis evaluation step performs a first analysis evaluation based on the analysis result of the first detailed mesh model obtained by the analysis steps and analysis result of the mesh model; and displaying the evaluation of the analysis result of the detailed mesh model on a display.

8. The structural analysis method according to claim 7, wherein the analysis step acquires a boundary value of the detailed mesh model from the analysis result of the mesh model and uses the boundary value to analyze the detailed mesh model.

9. The structural analysis method according to claim 7, wherein the analysis evaluation step performs the first analysis evaluation based on displacement of boundary contacts obtained as the analysis result of the first detailed mesh model and displacement of boundary contacts obtained as the analysis result of the mesh model.

10. The structural analysis method according to claim 7, wherein the analysis evaluation step performs a second analysis evaluation based on the analysis result of the second detailed mesh model and analysis result of the first detailed mesh model.

11. The structural analysis method according to claim 10, wherein the analysis evaluation step performs the second analysis evaluation based on the maximum stress obtained as the analysis result of the second detailed mesh model and maximum stress obtained as the analysis result of the first detailed mesh model.

12. The structural analysis method according to claim 7, wherein if the evaluation made by the analysis evaluation step does not satisfy a predetermined condition, the iso-surface creation step reduces the field value so as to create a new field iso-surface and the above respective steps are repeated to allow the analysis evaluation step to make evaluation once again.

13. The structural analysis method according to claim 11, wherein in the case where the first analysis evaluation made by the analysis evaluation step satisfies a predetermined condition, if the second analysis evaluation does not satisfy a predetermined condition, the above respective steps are repeated with the mesh size of the mesh model replaced by the mesh size of the second detailed mesh model to allow the analysis evaluation step to make evaluation once again.

14. A storage storing a structural analysis program allowing a computer to execute a structural analysis method and a result of an analysis of a mesh model, the program allowing the computer to execute:

an iso-surface creation step that creates a field iso-surface from an analysis result of a mesh model, using the mesh model obtained by dividing a model into meshes to perform analysis of displacement or stress;

a detailed mesh model creation step that uses the field iso-surface created by the iso-surface creation step to create a detailed mesh model which is a part of the mesh model and a characteristic part of the mesh model;

an analysis step that uses the analysis result of the mesh model stored in the storage to perform analysis of the detailed mesh model created by the detailed mesh model creation step; and an analysis evaluation step that evaluates the analysis result of the detailed mesh model based on the analysis result obtained by the analysis steps and analysis result of the mesh model; wherein the detailed mesh model creation step includes: a first detailed mesh model creation step that creates a first detailed mesh model with the same mesh size as that of the mesh model; and a second detailed mesh model creation step that creates a second detailed mesh model with a finer mesh size obtained by reducing the mesh size of the first detailed mesh model to a predetermined size, the analysis step analyzes the second detailed mesh model based on a first boundary value obtained by the analysis of the mesh model to obtain a second boundary value of the first detailed mesh model and uses the second boundary value to analyze the first detailed mesh model, and the analysis evaluation step performs a first analysis evaluation based on the analysis result of the first detailed mesh model obtained by the analysis steps and analysis result of the mesh model; and displaying the evaluation of the analysis result of the detailed mesh model on a display.

15. The structural analysis program according to claim 14, wherein the analysis step acquires a boundary value of the detailed mesh model from the analysis result of the mesh model and uses the boundary value to analyze the detailed mesh model.

16. The structural analysis program according to claim 14, wherein the analysis evaluation step performs the first analysis evaluation based on displacement of boundary contacts obtained as the analysis result of the first detailed mesh model and displacement of boundary contacts obtained as the analysis result of the mesh model.

17. The structural analysis program according to claim 14, wherein the analysis evaluation step performs a second analysis evaluation based on the analysis result of the second detailed mesh model and analysis result of the first detailed mesh model.

* * * * *

UNITED STATES PATENT AND TRADEMARK OFFICE
CERTIFICATE OF CORRECTION

PATENT NO. : 7,657,408 B2  Page 1 of 1
APPLICATION NO. : 11/585281
DATED : February 2, 2010
INVENTOR(S) : Shigeo Ishikawa It is certified that error appears in the above-identified patent and that said Letters Patent is hereby corrected as shown below:

Cover Page, Column 2 (Other Publications), Line 5, change "LInear" to --Linear--.

Column 9, Line 61, change "steps" to --step,--.

Column 10, Line 12, change "steps" to --step,--.

Column 11, Line 12, change "steps" to --step,--.

Column 12, Line 3, change "steps" to --step,--.

Signed and Sealed this

Twentieth Day of April, 2010

David J. Kappos
*Director of the United States Patent and Trademark Office*